(12) United States Patent
Tihanyi

(10) Patent No.: US 6,384,456 B1
(45) Date of Patent: May 7, 2002

(54) FIELD-EFFECT TRANSISTOR HAVING A HIGH PACKING DENSITY AND METHOD FOR FABRICATING IT

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/538,793

(22) Filed: Mar. 30, 2000

Related U.S. Application Data

(63) Continuation of application No. PCT/DE98/02382, filed on Aug. 14, 1998.

(30) Foreign Application Priority Data

Sep. 30, 1997 (DE) .......................................... 197 43 342

(51) Int. Cl.$^7$ .............................................. H01L 21/265
(52) U.S. Cl. ...................................... 257/401; 257/288
(58) Field of Search ................................. 257/401, 288; 438/589, FOR 197

(56) References Cited

U.S. PATENT DOCUMENTS

| | | | |
|---|---|---|---|
| 3,503,124 A | * | 3/1970 | Wanlass et al. |
| 5,093,273 A | * | 3/1992 | Okumura |
| 5,543,654 A | * | 8/1996 | Dennen |
| 5,973,360 A | * | 10/1999 | Tihanyi |
| 6,069,043 A | * | 5/2000 | Floyd et al. |
| 6,096,608 A | * | 8/2000 | Williams |

OTHER PUBLICATIONS

Wolf, 1990, Lattice Press, Silicon Processing for the VLSI Era, vol. 2, pps 12–13 and 126–127.*

* cited by examiner

Primary Examiner—George Fourson
Assistant Examiner—Thanh V Pham
(74) Attorney, Agent, or Firm—Herbert L. Lerner; Laurence A. Greenberg; Werner H. Stemer

(57) ABSTRACT

A field-effect transistor has a semiconductor body with a main area, in which at least one source zone and one drain zone are introduced and which is provided with a gate electrode isolated from a channel region disposed between a source zone and a drain zone by an insulator layer. In the field-effect transistor, the source zone, the drain zone and the channel region are disposed in walls of a respective trench or recess formed in the semiconductor body.

18 Claims, 4 Drawing Sheets

FIELD-EFFECT TRANSISTOR HAVING A HIGH PACKING DENSITY AND METHOD FOR FABRICATING IT

CROSS-REFERENCE TO RELATED APPLICATION

This is a continuation of copending International Application PCT/DE98/02383, filed Aug. 14, 1998, which designated the United States.

BACKGROUND OF THE INVENTION

Field of the Invention

The present invention relates to a field-effect transistor with a semiconductor body which has a main area, in which at least one source zone and one drain zone are introduced and which is provided with a gate electrode isolated from a channel region between the source zone and the drain zone by an insulator layer.

In semiconductor technology, as is known, the miniaturization of components has been a preferred aim for decades. Thus, in integrated circuits, ever higher integration levels are striven for in order to be able to accommodate as many components as possible on a chip. Transistor structures that manage with a minimal space requirement are also especially sought.

In the course of the miniaturization of components, the "third dimension" has already been included for some time now, by the introduction of trenches in a semiconductor body, the sidewalls and bottoms of the trenches are utilized as a seat for components. An example that may be mentioned here is VMOS technology or UMOS technology. Specifically with regard to UMOS technology, reference may be made here to IEEE Transactions on Electron Devices, Vol. 41 No. 5, May 1994, pp. 14–18, which describes a MOSFET structure with a U-shaped gate electrode which is formed in a trench of a semiconductor body, and a further trench for making contact with source and body regions of the MOSFET structure.

Although the above-mentioned problem situation, namely the creation of ever smaller structures of semiconductor components, has existed for decades, a satisfactory solution has not been achieved to the present day. Rather, success is achieved again and again in configuring ever smaller structures of individual components.

SUMMARY OF THE INVENTION

It is accordingly an object of the invention to provide a field-effect transistor having a high packing density and a method for fabricating it which overcome the above-mentioned disadvantages of the prior art devices and methods of this general type, which has the smallest possible dimensions according to the prior art.

With the foregoing and other objects in view there is provided, in accordance with the invention, a field-effect transistor, including:

a semiconductor body having a main area with isolated trenches formed therein, including a first trench, a second trench and a third trench, the semiconductor body having walls defining each of the trenches;

at least one source zone disposed in the walls defining the first trench;

at least one drain zone disposed in the walls defining the third trench;

a channel region disposed in the walls defining the second trench and disposed between the source zone and the drain zone;

an insulator layer disposed in the semiconductor body; and a gate electrode isolated from the channel region by the insulator layer.

In the case of the field-effect transistor of the type mentioned in the introduction, the object is achieved according to the invention by virtue of the fact that the source zone, the drain zone and the channel region are disposed in walls of a respective trench provided in the semiconductor body.

In other words, in the field-effect transistor according to the invention, three recesses, so-called "trenches", are made in a, for example, p-doped surface of a semiconductor body. The trenches essentially lie in a row next to one another. The middle trench is provided with an oxide wall, while the two lateral trenches have an n-doped edge in the present example. In this case, the doping may be effected by diffusion from the trenches. In this case, the doping zones of the n-doped edges of the lateral trenches make contact with the oxide wall of the middle trench. The interior space of all the trenches is filled with a readily conductive material such as, for example, $n^+$-doped polycrystalline silicon or else a metal such as, for example, aluminum, with the result that three "plugs" are present. The middle plug in the middle trench then forms the gate electrode of the field-effect transistor, while the two lateral plugs in the lateral trenches serve as source electrode and drain electrode, respectively. The current channel is routed at the sidewall of the middle plug in the semiconductor material behind the oxide wall.

The field-effect transistor according to the invention requires an extremely small space, since the individual trenches for the source, the drain and the gate electrode can be made extremely small, yet it is nonetheless possible to realize structures having large channel widths, which are given by the depth of the middle plug, and short channel lengths, which are predetermined by half the circumference of the middle trench.

What is essential about the present invention, therefore, is that, for the individual active zones of the field-effect transistor, that is to say the source zone, the drain zone and the channel region, separate trenches having extremely small dimensions are provided and are each "filled" with the corresponding electrodes.

Preferred areas of application of the invention are CMOS-ICs and DRAMS, for example. However, it shall be expressly emphasized that an application of the invention in the case of bipolar structures as well is possible and advantageous. If the middle trench in the example above is provided, in its edge, with p-doping instead of an oxide wall, then an npn transistor is present whose three active zones, namely an emitter zone, a base zone and a collector zone, are formed by the dopings in the walls of three trenches, the respective electrodes being composed of the above-mentioned $n^+$-doped polycrystalline silicon in the respective trenches.

The trenches themselves may have an essentially round or circular cross section. It goes without saying, however, that other configurations of the trenches are also possible. Thus, elliptic trenches or indeed rectangular trenches, etc. are readily conceivable. It should be noted that the channel length in the case of the field-effect transistor is given by half the circumference of the middle trench. A short channel length can thus be realized by using an elliptic cross section, for example, instead of a round cross section for the middle trench, the longitudinal axis of the ellipse running between the center points of the two lateral trenches.

In general, the present invention makes it possible to fabricate semiconductor components, and in particular field-effect transistors, which have submicron scale dimensions.

Other advantageous developments of the invention are described below.

The field-effect transistor according to the invention can, for example, readily be equipped with oxide isolation.

Furthermore, it is possible to allow for instance the doping concentration of the drain zone to rise continuously from "the outside in", that is to say from the semiconductor body toward the plug made of polycrystalline silicon, thereby giving rise to an "LDD"-like improvement in the dielectric strength (LDD="Lightly Doped Drain"). It is also possible to introduce a region having an elevated doping concentration underneath individual plugs, for example underneath the middle gate plug. The, for example, n$^+$-doped polycrystalline silicon of the individual plugs may also additionally be used as one or more interconnect planes, as a result of which a further increase in the integration level of a corresponding integrated circuit is achieved. The gate- or source-drain resistances can be reduced by introducing titanium nitride or any silicides in the wall of the plugs made of polycrystalline silicon or in a the center of said plugs.

A particularly advantageous development of the invention relates to the application thereof to SOI technology (SOI= silicon on insulator). In this case, the trenches for the source, the drain and the gate only make contact with an Si island embedded in an insulator, the trenches having cross sections in the form of circle sectors, for example. The trenches for source and drain, however, likewise serve as diffusion sources for arsenic and/or phosphorus, for example, while the middle trench has the oxide wall and accommodates the gate electrode.

In addition, it is also possible to provide a terminal for the semiconductor body itself in a fourth trench or recess, from which a p-type dopant, for example, diffuses in order that the threshold voltage of the field-effect transistor can be set precisely.

Since the trenches themselves are embedded approximately by half or more in insulator material, the actual silicon "island" can be embodied such that it-is particular small in the submicron range, as a result of which packing densities not achieved before can be realized.

Other features which are considered as characteristic for the invention are set forth in the appended claims.

Although the invention is illustrated and described herein as embodied in a field-effect transistor having a high packing density and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
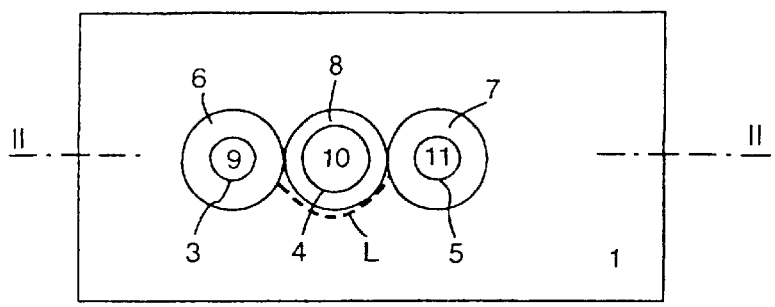
FIG. 1 is a sectional view of a first exemplary embodiment of a "supertrench FET" in an n-channel version taken along the line I—I shown in FIG. 2 and according to the invention.

In all the figures of the drawing, sub-features and integral parts that correspond to one another bear the same reference symbol in each case. Referring now to the figures of the drawing in detail and first, particularly, to FIGS. 1–3 thereof, there is shown a "supertrench FET" in an n-channel version according to a first exemplary embodiment of the invention. Recesses 3, 4 and 5, so-called "trenches", which have approximately a circular cross section (see FIG. 1) and a diameter of approximately 0.1 to approximately 1 μm, are introduced in a p-conducting semiconductor 1 made of silicon with a doping concentration of approximately $10^{15}$ to approximately $10^{16}$ charge carriers cm$^{-3}$. The distance between center lines of the individual recesses 3, 4 and 4, 5 may be approximately 0.1 to approximately 1 μm. However, values smaller than the specified values are also possible.

From sidewalls and a bottom of the two lateral recesses 3, 5, n-type dopant, for example phosphorus or arsenic, is diffused into the semiconductor body 1, thereby producing a source zone 6 and a drain zone 7 with a doping concentration of approximately $10^{17}$ to approximately $10^{19}$ charge carriers/cm$^3$. A sidewall and a bottom of a middle recess 4 are covered by a silicon dioxide layer 8. Instead of silicon dioxide, it is also possible to use another suitable insulating material, such as silicon nitride for example.

The recesses 3, 4 and 5 configured in this way are then filled with n$^+$-doped polycrystalline silicon, which thus forms "plugs" 9, 10 and 11.

It shall be expressly pointed out, that in the present exemplary embodiment, the conductivity types of the individual zones and of the semiconductor body 1 can also be reversed, that is to say, instead of the p-conducting semiconductor body 1, it is also possible to use an n-conducting semiconductor body, the zones 6 and 7 then being p-doped. The same also applies to the exemplary embodiments below.

The plugs 9, 10 and 11 respectively serve as an electrode for the source S, the gate G and the drain D.

Figure 3:
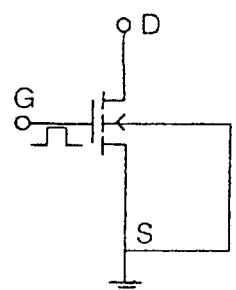
FIG. 3 is a basic circuit diagram of the FET shown in FIGS. 1 and 2.

If appropriate, a further terminal B may also additionally be provided for in the semiconductor body 1 or "body", which terminal may likewise be formed by a non-illustrated recess. A p-type dopant may be outdiffused from the recess of the further terminal B in order that the threshold voltage of the FET can be set precisely. The further terminal B can, as is shown in FIG. 3, be grounded together with the source S.

The invention makes it possible to realize a field-effect transistor having a large channel width, which is given by a depth of the recesses 3, 4 and 5, and a small channel length L (see FIG. 1), which amounts to approximately half the circumference of the recess 4 or of the silicon dioxide layer 8. In this case, it must be ensured, of course, that the doping of the source zone 6 and/or the doping of the drain zone 7 at least make contact with the silicon dioxide layer 8.

By correspondingly configuring the depth of the recesses 3, 4 and 5 and reducing the diameter of the recess 4, the channel width can be configured practically such that it is as large as desired and the channel length can be configured such that it is very small.

The dopings of the source zone 6 and of the drain zone 7 can be introduced in a customary manner by diffusion. The same also applies to the growth of the oxide layer 8 in the surface of the recess 4.

Figure 4:
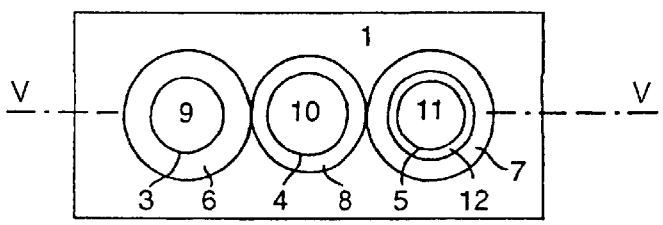
FIG. 4 is a sectional view through a second exemplary embodiment of a dynamic memory cell having the "super-trench FET", taken along the line IV—IV shown in FIG. 5.
Figure 6:
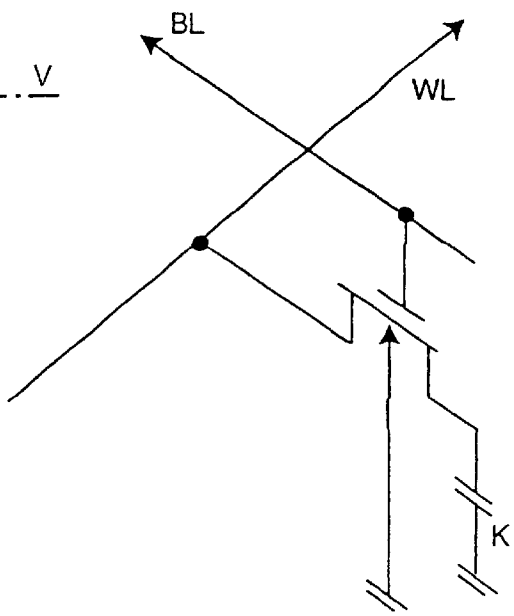
FIG. 6 is a basic circuit diagram of the dynamic memory cell shown in FIGS. 4 and 5.
Figure 5:
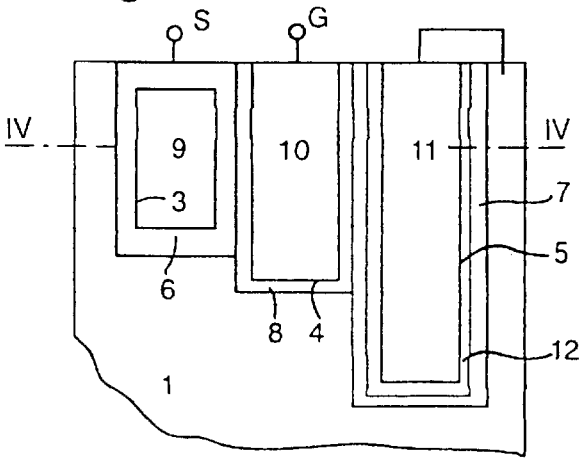
FIG. 5 is a fragmented, sectional view taken along the line V—V shown in FIG. 4.

FIGS. 4 to 6 show a second exemplary embodiment of the invention with a memory cell which uses the "supertrench FET" and is connected to a word line WL and a bit line BL (see FIG. 6).

Figure 2:
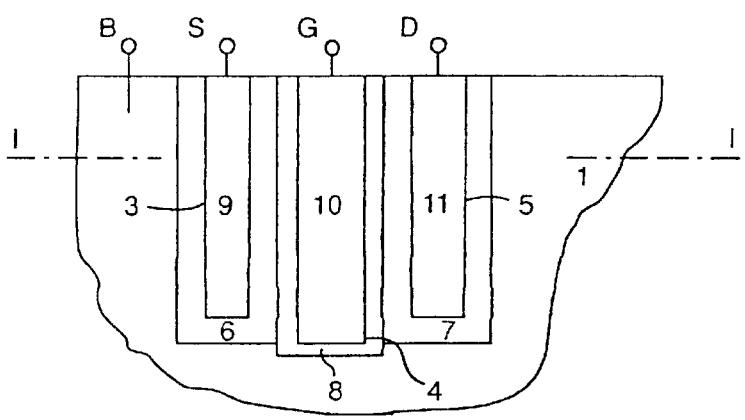
FIG. 2 is a fragmented, sectional view of the first exemplary embodiment of the "supertrench FET" taken along the line II—II shown in FIG. 1.

In contrast to the exemplary embodiment of FIGS. 1 to 3, the "supertrench FET" of the present exemplary embodiment of FIGS. 4 to 6 has another insulator layer 12 in the recess 5 of the drain electrode 11, with the result that the drain electrode 11 is in this case coupled capacitively to the semiconductor body 1 (see FIGS. 4 and 6). In addition, this exemplary embodiment shows that the recesses 3, 4 and 5 can have entirely different penetration depths. In this case, the capacitance of a capacitor K (see FIG. 6) is essentially defined by the penetration depth of the recess 5.

The exemplary embodiment of FIGS. 4 to 6 is particularly suitable for CMOS-ICs and DRAMs.

Figure 7:
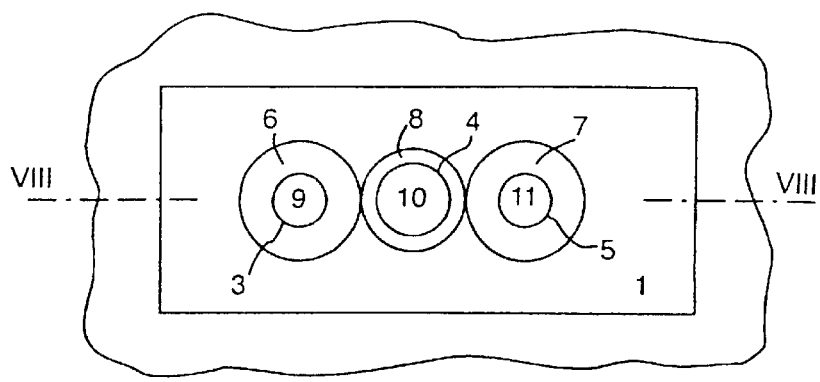
FIGS. 7 is a sectional view of a third exemplary embodiment of the "supertrench FET" having an oxide isolation and taken along the line VII—VII shown in FIG. 8.
Figure 8:
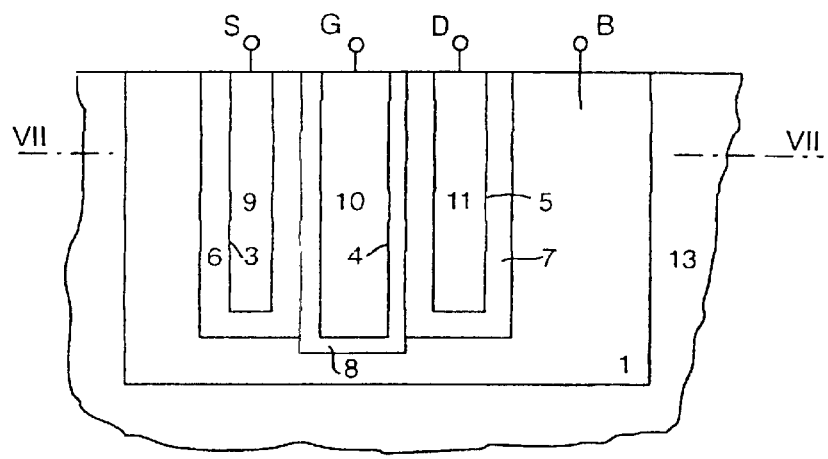
FIG. 8 is a sectional view taken along the line VIII—VIII shown in FIG. 7.

A third exemplary embodiment shown in FIGS. 7 and 8 essentially corresponds to the first exemplary embodiment of FIGS. 1 and 3, but in this case an oxide isolation 13 made of silicon oxide, for example, is also additionally provided around the semiconductor body 1.

The doping of the drain plug 11 may rise continuously from the outside in, in order thus to obtain an LDD-like improvement in the dielectric strength. Titanium nitride or some silicide or other may be introduced at the walls of the individual plugs 9, 10 and 11 or in the center thereof, in order thus to reduce the gate- or source-drain resistances. The same also applies to the corresponding other exemplary embodiments.

Figure 9:
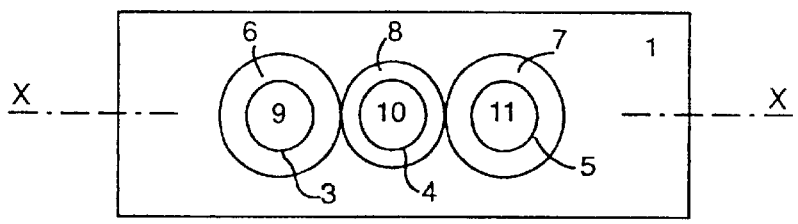
FIG. 9 is a sectional view of a fourth exemplary embodiment of the "supertrench FET" having polysilicon interconnects taken along line IX—IX shown in FIG. 10.
Figure 10:
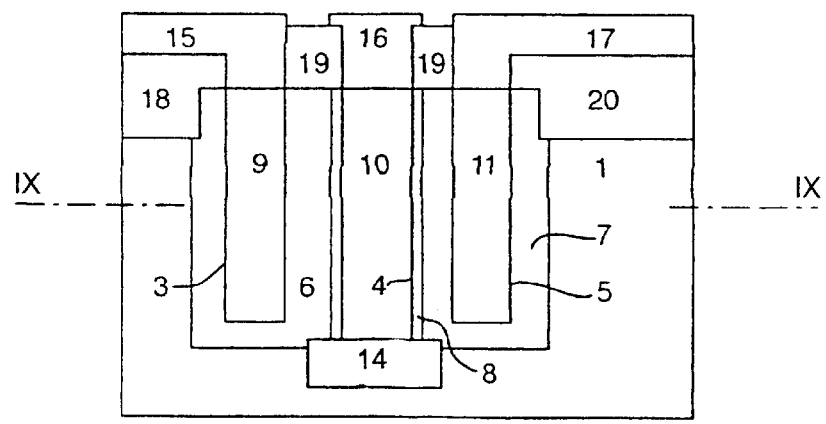
FIG. 10 is a sectional view taken along the line X—X shown in FIG. 9.

FIGS. 9 and 10 show an exemplary embodiment in which a heavily doped $p^+$-conducting zone 14 is also provided underneath the gate plug 10, and in which the plugs 9, 10 and 11 for the 1r source S, the gate G and the drain D are connected to polysilicon interconnects 15, 16 and 17, which are isolated from one another and from the semiconductor body 1 by insulating layers 18, 19 and 20.

Figure 11:
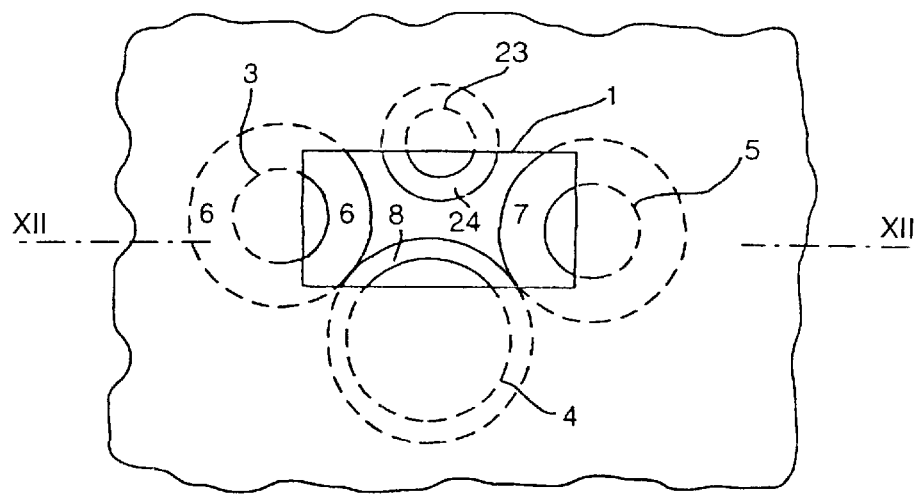
FIGS. 11 is a fragmented, sectional view of a fifth exemplary embodiment of the "supertrench FET" using SOI technology taken along the line XI—XI shown in FIG. 12.
Figure 12:
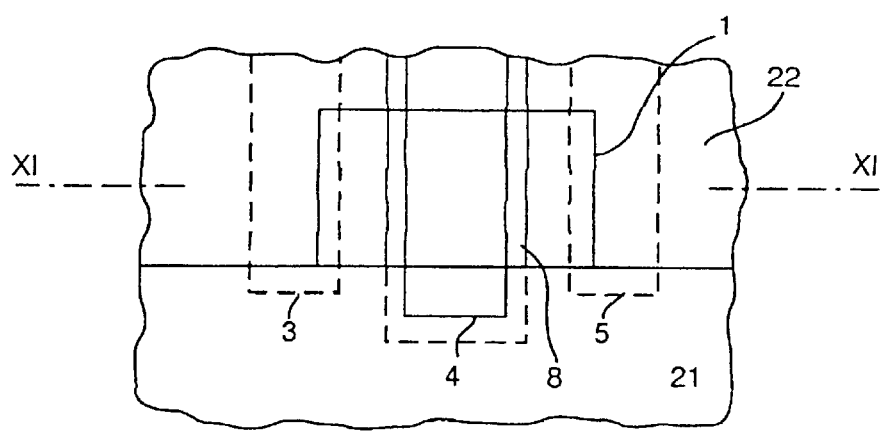
FIG. 12 is a fragmented, sectional view taken along the line XII—XII shown in FIG. 11.

FIGS. 11 and 12 show an exemplary embodiment of the "supertrench FET" according to the invention using silicon on insulator (SOI) technology. In this case, the semiconductor body 1 contains a monocrystalline "island" which is disposed on an insulator 21 and is encapsulated by a further insulator 22. In this case, the recesses 3, 4 and 5 are only partly embodied as circle sectors in the monocrystalline semiconductor body 1 and do not lie directly in a straight line. This makes it possible to reduce the channel length between the source zone 6 and the drain zone 7.

Moreover, an additional recess 23 for the "body electrode" B is also shown in this exemplary embodiment, from which p-type dopant is diffused into the semiconductor body for the purpose of forming a p-type zone 24. This makes it possible to precisely set the threshold voltage of the field-effect transistor.

Figure 13A:
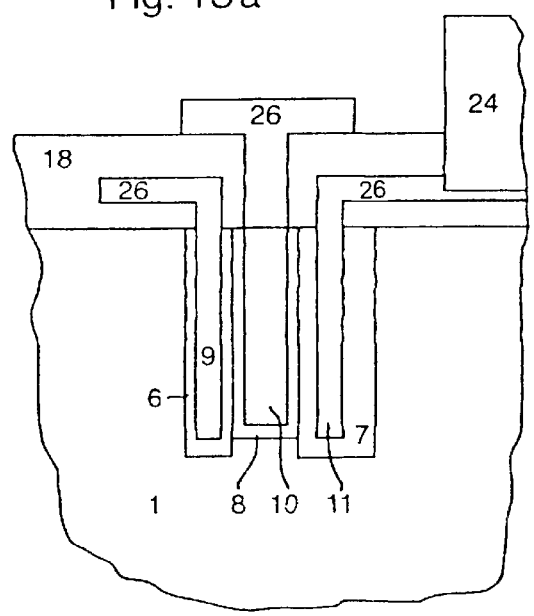
FIGS. 13a and 13b are fragmented, sectional views of a sixth exemplary embodiment which show how electrodes in different planes form a plurality of layers.
Figure 13B:
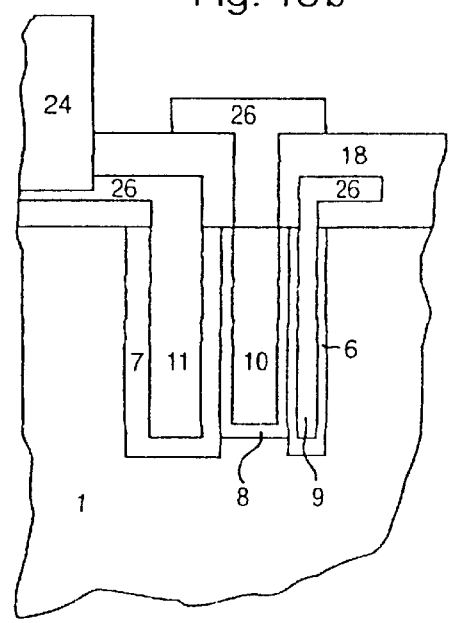

FIGS. 13(a) and 13(b) show an exemplary embodiment in which the electrodes 9, 10, 11 composed of $n^+$-doped polycrystalline silicon in different planes form interconnects 26 in a S5 plurality of layers, one layer being connected to a metallization layer 26 made of aluminum for example. The layers of the electrodes 9, 11 are fabricated in a first step, for example, while the layer of the electrode 10 follows in a second step.

Figure 14A:
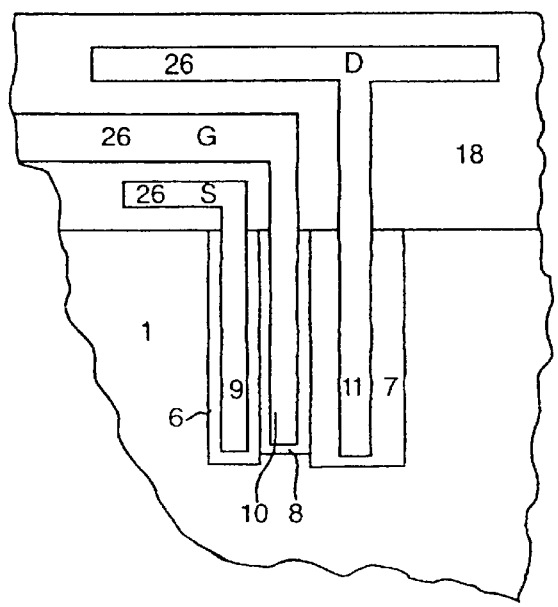
FIGS. 14a and 14b are fragmented, sectional views of a seventh exemplary embodiment which show how terminals in three wiring planes are embodied in a manner insulated from one another.
Figure 14B:
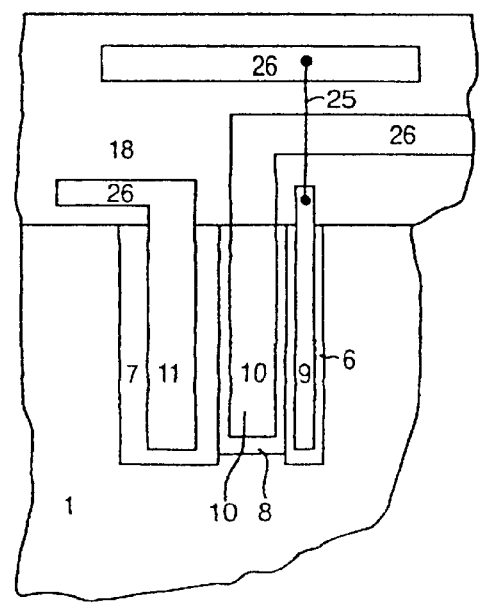

FIGS. 14(a) and 14(b) show an exemplary embodiment which is similar to the exemplary embodiment of FIGS. 13(a) and 13(b) and in which the layers of the interconnects for the source S, the drain D and the gate G are disposed in three planes, FIG. 14(b) illustrating a case in which a connection is made between the electrode 9 and the interconnect 26 via a connecting hole (not shown) (see reference symbol 25) in the insulator layer 18.

I claim:

1. A field-effect transistor, comprising:
    a semiconductor body having a main area with isolated trenches formed therein, including a first trench, a second trench and a third trench, said semiconductor body having walls defining each of said trenches;
    at least one source zone disposed in said walls defining said first trench;
    at least one drain zone disposed in said walls defining said third trench;
    a channel region disposed in said walls defining said second trench and disposed between said source zone and said drain zone;
    an insulator layer disposed in said semiconductor body;
    a gate electrode isolated from said channel region by said insulator layer;
    a source electrode disposed in said first trench; and
    a drain electrode disposed in said third trench.

2. The field-effect transistor according to claim 1, wherein said trenches each have an substantially round cross section.

3. The field-effect transistor according to claim 1, wherein said second trench for said channel region is disposed between said first trench and said third trench such that said source zone and said drain zone each make contact with said insulator layer.

4. The field-effect transistor according to claim 1, wherein said gate electrode, said source electrode and said drain electrode are composed of heavily doped polycrystalline silicon.

5. The field-effect transistor according to claim 1, wherein said semiconductor body is p-doped.

6. The field-effect transistor according to claim 1, wherein said drain zone has a doping concentration that rises toward said drain electrode.

7. The field-effect transistor according to claim 1, including an insulating material embedding said semiconductor body.

8. The field-effect transistor according to claim 1, including an insulator and said semiconductor body is disposed on said insulator.

9. The field-effect transistor according to claim 1, including at least one of titanium nitride and a silicide disposed in said walls of said trenches.

10. The field-effect transistor according to claim 1, wherein said semiconductor body has a further trench formed therein for a terminal.

11. The field-effect transistor according to claim 1, wherein said source zone and said drain zone are doped with at least one of arsenic and phosphorus.

12. The field-effect transistor according to claim 1, including a doped zone disposed underneath said gate electrode.

13. The field-effect transistor according to claim 12, wherein said semiconductor body has a given conductivity type and said doped zone has a conductivity type that is the same as said given conductivity type of said semiconductor body.

14. The field-effect transistor according to claim 1, wherein said drain electrode, said gate electrode and said source electrode form layers of interconnects.

15. The field-effect transistor according to claim 14, wherein said interconnects are disposed in different planes.

16. The field-effect transistor according to claim 1, wherein said trenches each have a diameter of from 0.1 to 1 $\mu$m and center lines at a distance of approximately 0.1 to 1 $\mu$m from one another.

17. A dynamic random access memory, comprising:

a field-effect transistor, including:
   a semiconductor body having a main area with isolated trenches formed therein, including a first trench, a second trench and a third trench, said semiconductor body having walls defining each of said trenches;
   at least one source zone disposed in said walls defining said first trench;
   at least one drain zone disposed in said walls defining said third trench;
   a channel region disposed in said walls defining said second trench and disposed between said source zone and said drain zone;
   an insulator layer disposed in said semiconductor body;
   a gate electrode isolated from said channel region by said insulator layer;
   a source electrode disposed in said first trench; and
   a drain electrode disposed in said third trench.

18. A CMOS-integrated circuit, comprising:

a field-effect transistor, including:
   a semiconductor body having a main area with isolated trenches formed therein, including a first trench, a second trench and a third trench, said semiconductor body having walls defining each of said trenches;
   at least one source zone disposed in said walls defining said first trench;
   at least one drain zone disposed in said walls defining said third trench;
   a channel region disposed in said walls defining said second trench and disposed between said source zone and said drain zone;
   an insulator layer disposed in said semiconductor body;
   a gate electrode isolated from said channel region by said insulator layer;
   a source electrode disposed in said first trench; and
   a drain electrode disposed in said third trench.

* * * * *